(12) United States Patent
Hwang et al.

(10) Patent No.: US 6,560,265 B2
(45) Date of Patent: May 6, 2003

(54) METHOD AND APPARATUS FOR POLARIZING LIGHT IN A VCSEL

(75) Inventors: Wen-Yen Hwang, Sugar Land, TX (US); James N. Baillargeon, Springfield, NJ (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 8 days.

(21) Appl. No.: 09/951,298

(22) Filed: Sep. 11, 2001

(65) Prior Publication Data

US 2003/0048827 A1 Mar. 13, 2003

(51) Int. Cl.$^7$ .............................................. H01L 29/06
(52) U.S. Cl. .......................................... 372/96; 372/43
(58) Field of Search ............................ 372/96, 43, 45, 372/46, 50, 92, 99, 106

(56) References Cited

U.S. PATENT DOCUMENTS

| | | | | |
|---|---|---|---|---|
| 5,995,531 A | * | 11/1999 | Gaw et al. | 372/96 |
| 6,002,705 A | * | 12/1999 | Thornton | 372/96 |
| 6,031,243 A | * | 2/2000 | Taylor | 257/13 |
| 6,301,281 B1 | * | 10/2001 | Deng et al. | 372/45 |

* cited by examiner

Primary Examiner—Paul Ip
Assistant Examiner—Dung Nguyen
(74) Attorney, Agent, or Firm—N. Stephan Kinsella

(57) ABSTRACT

The present invention is directed to a VCSEL and method of fabricating same. First, a substrate is provided. Then, a first reflector is disposed (where "disposed" includes being deposited or epitaxially grown) on the substrate, which is followed by an active region being disposed on the first reflector. Then, a second reflector is disposed on the active region such that the active region is interposed between the first reflector and the second reflector. Then, a polarizer is formed inside, or on the top or bottom of, the second reflector. The polarizer contains parallel stripes of material doped differently than that of the second reflector. The polarizer polarizes the light generated from the active region.

43 Claims, 3 Drawing Sheets

METHOD AND APPARATUS FOR POLARIZING LIGHT IN A VCSEL

BACKGROUND OF THE INVENTION

1. Field of the Invention

This invention relates generally to optical devices and, in particular, to vertical-cavity surface-emitting lasers (VCSELs).

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. The possibility of amplification of electromagnetic waves in a semiconductor superlattice structure, i.e., the possibility of semiconductor diode lasers, was predicted in a seminal paper by R. F. Kazarinov, et al., "Possibility of the Amplification of Electromagnetic Waves in a Semiconductor with a Superlattice," *Soviet Physics Semiconductors*, vol. 5, No. 4, pp. 707–709 (October 1971). Semiconductor laser technology has continued to develop since this discovery.

There are a variety of types of semiconductor lasers. Semiconductor lasers may be diode lasers (bipolar) or non-diode lasers such as quantum cascade (QC) lasers (unipolar). Semiconductor lasers of various types may be electrically pumped (EP) (by a direct or alternating current), or pumped in other ways, such as by optically pumping (OP) or electron beam pumping. Semiconductor lasers are used for a variety of applications and can be built with different structures and semiconductor materials, such as gallium arsenide (GaAs).

Semiconductor lasers are typically powered by applying an electrical potential difference across the active region, which causes a current to flow therein. Electrons in the active region attain high energy states as a result of the potential applied. When the electrons spontaneously drop in energy state, photons are produced (to carry away the energy lost by the transition, so as to conserve energy). Some of those photons travel in a direction perpendicular to the reflectors of the laser. As a result of the ensuing reflections, the photons can travel through the active region multiple times.

Stimulated emission occurs when an electron is in a higher energy level and a photon with an energy equal to the difference between the electron's energy and a lower energy interacts with the electron. In this case, the photon stimulates the electron to fall into the lower energy state, thereby emitting a photon. The emitted photon will have the same energy as the original photon, and, if viewed as waves, there will be two waves emitted (from the electron's atom) in phase with the same frequency. Thus, when the photons produced by spontaneous electron transition photons interact with other high energy state electrons, stimulated emission can occur so that two photons with identical characteristics are present. If most electrons encountered by the photons are in the high energy state, the number of photons traveling between the reflectors tends to increase, giving rise to amplification of light and thus lasing.

The use of semiconductor diode lasers for forming a source of optical energy is attractive for a number of reasons. For example, diode lasers have a relatively small volume and consume a small amount of power as compared to conventional laser devices. Further, the diode laser is a monolithic device, and does not require a combination of a resonant cavity with external mirrors and other structures to generate a coherent output laser beam.

Additionally, semiconductor lasers may be edge-emitting lasers or surface-emitting lasers (SELs). Edge-emitting semiconductor lasers output their radiation parallel to the wafer surface, while in SELs, the radiation output is perpendicular to the wafer surface.

One type of SEL is the vertical-cavity surface-emitting laser (VCSEL). The VCSEL structure usually consists of an active (optical gain) region sandwiched between two distributed Bragg reflector (DBR) mirrors: a top, exit DBR, and a bottom DBR. DBRs are sometimes referred to as mirror stacks. The DBR mirrors of a typical VCSEL can be constructed from dielectric or semiconductor layers (or a combination of both, including metal mirror sections). DBRs or mirror stacks in VCSELs are typically formed of multiple pairs of layers often referred to as mirror pairs. The pairs of layers are formed of a material system generally consisting of two materials having different indices of refraction and being easily lattice matched to the other portions of the VCSEL. The number of mirror pairs per stack may range from 4–60 pairs to achieve a high percentage of reflectivity, depending on the difference between the refractive indices of the layers. A larger number of mirror pairs increases the percentage of reflected light (reflectivity).

When properly designed, these mirror pairs will cause a desired reflectivity at the laser wavelength. Typically in a VCSEL, the mirrors are designed so that the bottom DBR mirror (i.e. the one interposed between the substrate material and the active region) has nearly 100% reflectivity, while the top DBR mirror has a reflectivity that may be 98%–99.5% (depending on the details of the laser design). Of course, various laser structures may vary from these general properties.

High reflectivity (approaching 100%) at the bottom DBR mirror is generally desired in a VCSEL for two reasons. First, any portion of the optical field that "leaks" out the back of the bottom DBR mirror represents a power loss that reduces efficiency. This reduced efficiency may be so great so as to prevent the laser from operating at all (i.e. the efficiency goes to zero). A second reason why a nearly unity reflection coefficient is desired for the bottom DBR mirror is related to the issue of optical feedback into the laser cavity.

VCSELs have many attractive features such as low threshold current, single longitudinal mode, a circular output beam, among others. However, problems of polarization stabilization remain unsolved because of the isotropy of the gain of VCSELs. Because of the circularly symmetric design of the VCSEL cavity, the VCSEL polarization direction is not limited. Therefore, the polarization direction of the emitted light is random and is easily switched due to stress, injected current, or reflected light. Directly modulating a VCSEL can lead to severe polarization noise, for example, partly because under modulation, the polarization extinction ratio decreases. Thus, the absence of a well-defined polarization selection mechanism leads to the coexistence, switching, or bistability of lasing modes and even to the rotation of the polarization eigenstates (0 degree and 90 degree polarization) with a change in the drive current or temperature. When the dominant polarization is different for different transverse modes, mode partition will cause fluctuations in the polarization state of the VCSEL output.

Polarization instability is undesirable in many applications. Polarization control would be useful in applications such as optical free-space routing and in a polarization-duplicated transmitter, or optical head. For example, free-space systems frequently rely on polarization-sensitive, diffractive optical elements, such as holograms, for splitting and routing of various optical information channels, or other types of beamsplitters. Additionally, polarization needs to be well controlled to avoid polarization-induced noise caused by the unstable polarization states. Polarization-stabilized VCSELs can show significantly reduced transient partition between orthogonally polarized lasing modes, for example. Efforts have been made to control polarization by using differences in sidewall reflectivity or stress from an elliptical window hole. Also, an asymmetrically designed active layer has been proposed. However, a method to effectively control polarization has not yet been developed. For example, a metal grating could be added to polarize a laser's output, but this could cause scattering. These and related matters are discussed in *Vertical-Cavity Surface-Emitting Lasers: Design, Fabrication, Characterization, and Applications,* edited by Carl W. Wilmsen, Henryk Temkin, and Larry A. Coldren (Cambridge University Press, 1999), particularly sections 6.1, 6.3, 10.1, and 10.2, which are incorporated herein by reference; also J. H. Ser et al., "Polarization Stabilization of Vertical-Cavity Top-Surface-Emitting Lasers by Inscription of Fine Metal-Interlaced Gratings," *Appl. Phys. Lett.,* Vol. 66, No. 21, May 22, 1995, pp. 2769–2771, which article is incorporated herein by reference.

There is therefore a need for improved VCSELs having a well-defined polarization selection mechanism.

SUMMARY OF THE INVENTION

The present invention is directed to a VCSEL and method of fabricating same. First, a substrate is provided. Then, a first reflector is disposed (where "disposed" includes being deposited or epitaxially grown) on the substrate, which is followed by an active region being disposed on the first reflector. Then, a second reflector is disposed on the active region such that the active region is interposed between the first reflector and the second reflector. Then, a polarizer is formed inside the second reflector. The polarizer contains parallel stripes of material doped differently than that of the other parts of the second reflector. The polarizer polarizes the light generated from the active region.

Another embodiment of the present invention is directed to a VCSEL that includes a substrate, a first reflector disposed on the substrate, an active region disposed on the first reflector, and a second reflector disposed on the active region such that the active region is interposed between the first reflector and the second reflector. The second reflector includes a polarizer for polarizing light generated from the active region. The polarizer contains parallel stripes of material doped differently than that of the second reflector.

Another embodiment is directed to a method for fabricating a polarizer for polarizing light in a VCSEL, which includes a substrate, a first reflector disposed on the substrate, an active region disposed on the first reflector, and a second reflector disposed on the active region such that the active region is interposed between the first reflector and the second reflector. The method includes the steps of growing a first layer of a first doped material on the active region, growing a second layer of a second doped material on the first layer, growing a third layer of the first doped material on the second layer, etching one or more grooves through the second and third layers into the first layer, and covering the etched grooves with the first doped material so as to form parallel stripes with the second layer. In an embodiment, the polarizer reflects to a relatively greater degree light with an electric (E) field vector (polarization) parallel to the stripes and reflects to a relatively smaller degree light with an E field vector perpendicular to the stripes. Because the polarizer reflects to a higher degree light having parallel polarization, it may be said to relatively reflect light with an E field vector parallel to the stripes and to relatively transmit light having an E field vector perpendicular to the stripes. In this application, therefore, to "relatively reflect" light with an E field vector parallel to the stripes and to "relatively transmit" light having an E field vector perpendicular to the stripes means that the polarizer has a higher reflectivity, and thus a lower transparency, for light with an E field vector parallel to the stripes, than for light with an E field vector perpendicular to the stripes. In another embodiment, the polarizer substantially reflects light with an E field vector parallel to the stripes and substantially transmits light with an E field vector perpendicular to the stripes.

Another embodiment in accordance with the present invention is a method for fabricating a polarizer, which includes the steps of growing a first semiconductor layer of a first doped material, growing a second semiconductor layer of a second doped material on the first semiconductor layer, growing a third semiconductor layer of the first doped material on the second semiconductor layer, etching one or more grooves through the second and third semiconductor layers into the first semiconductor layer, and covering the etched grooves with the first doped material so as to form parallel stripes with the second semiconductor layer. The polarizer relatively reflects light having an E field vector parallel to the stripes and relatively transmits light having an E field vector perpendicular to the stripes.

Another embodiment in accordance with the present invention is a polarizer that includes a semiconductor layer. The semiconductor layer has parallel stripes of material doped differently than that of the rest of the semiconductor layer. The stripes are composed of the same material as the semiconductor layer. The polarizer relatively reflects light having an E field vector parallel to the stripes and relatively transmits light having an E field vector perpendicular to the stripes.

Another embodiment is a method for polarizing light in a VCSEL, which includes a substrate, a first reflector disposed on the substrate, an active region disposed on the first reflector, and a second reflector disposed on the active region such that the active region is interposed between the first reflector and the second reflector. The method includes the steps of: generating light in the active region of the VCSEL and subjecting the light to a polarizer fabricated inside the second reflector, where "inside" indicates that the polarizer is between the lower and upper ends of the second reflector. The polarizer includes parallel stripes of material doped differently than that of the second reflector.

An advantage of the present invention is that the VCSEL will emit light with a predictable and stable polarization.

Other and further features and advantages will be apparent from the following description of presently preferred embodiments of the invention, given for the purpose of disclosure and taken in conjunction with the accompanying drawings. Not all embodiments of the invention will include all the specified advantages.

BRIEF DESCRIPTION OF THE DRAWINGS

Other features and advantages of the invention will become apparent upon study of the following description, taken in conjunction with the attached FIGS. 1–6.

DETAILED DESCRIPTION OF THE INVENTION

Figure 1:
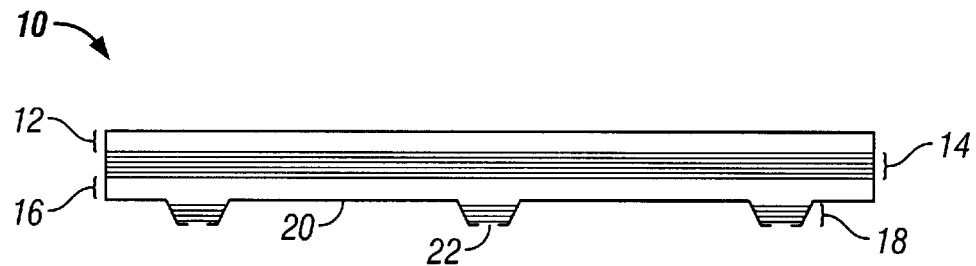
FIG. 1 illustrates a cross-sectional view of a one-dimensional array of VCSELs.

As noted above, the subject of the present invention is a VCSEL and method for fabricating same so as to selectively transmit light having a desired polarization. A great number of variations of the methods, materials, and structures described below are possible. Referring now to FIG. 1, a one-dimensional array 10 of VCSELs is shown in cross-section, the cross-sectional view illustrating three VCSELs of VCSEL array 10. Array 10 is a one-dimensional (linear) array having a single row of N VCSELs. As will be appreciated, a VCSEL is a semiconductor laser that emits its output perpendicular to (the plane of) its p-n junction. Each VCSEL is built on a substrate 12 of semiconductor material. Various semiconductor materials known to those in the art can be employed.

Each VCSEL shares a first reflector (layer) 14. In one embodiment, the first reflector 14 comprises a DBR. A DBR consists of alternating layers of different semiconductors or different dielectrics, i.e., the DBR may consist of dielectric or semiconductor material. In one embodiment, approximately forty alternating layers yield a reflectivity of 99.99%.

Each VCSEL also shares the common active region layer 16 of VCSEL array 10. The active region 16 is a p-n junction and the width (i.e., thickness) of the active region 16 controls the wavelength of emitted light. The widths (i.e., thicknesses) of the first (bottom) reflector 14, active region 16, and second (top) reflector 18 are very small compared to the width of the substrate 12. (The widths shown for the various layers in FIG. 1 are not to scale.)

In the embodiment shown in FIG. 1, the second reflector 18 is separate for each VCSEL. In another embodiment, the VCSELs can share a common second reflector 18. In an embodiment, the second reflector 18 comprises a DBR. The second reflector 18 is highly reflective, but preferably less reflective than the first reflector 14. In one embodiment, twenty-five alternating layers yield a reflectivity of 99.9%.

A cladding 20 protects the VCSEL structure. Adjacent the second reflector 18, the cladding 20 defines a gap 22 that allows emission of radiation from the active region 16. The profile of the emitted radiation can be controlled by modifying the geometry of the emission area. For example, changes in the shape and size of the gap 22 affect the spatial profile of the emitted radiation. The distance between the active region 16 and the gap 22 also affects the spatial profile of the emitted radiation. The use of photolithographic techniques in defining the features of the VCSEL array allows highly accurate placing of the VCSELs and highly accurate definition of VCSEL output profiles.

Figure 2:
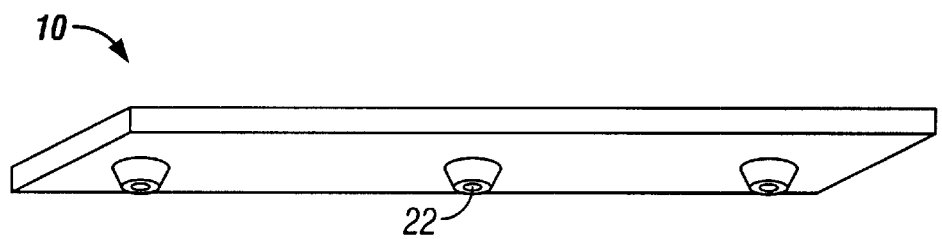
FIG. 2 is an isometric view of the one-dimensional array of VCSELs of FIG. 1.

Referring now to FIG. 2, an isometric view of a linear array 10 of VCSELs is depicted. Most of the structural aspects of the VCSELs are not visible from an outside view. The gaps 22 are visible and allow radiation to be emitted. As with FIG. 1, the dimensions have been rendered disproportional in order to make visible the various features. In various embodiments, the VCSEL separation and height are much reduced relative to the thickness of the substrate. FIG. 2 shows a linear array 10 of VCSELs manufactured such that radiation from each VCSEL is emitted along substantially parallel paths. While three VCSELs of the array are illustrated in FIG. 2, other embodiments include arrays having a large number of linearly arranged VCSELs.

Figure 3:
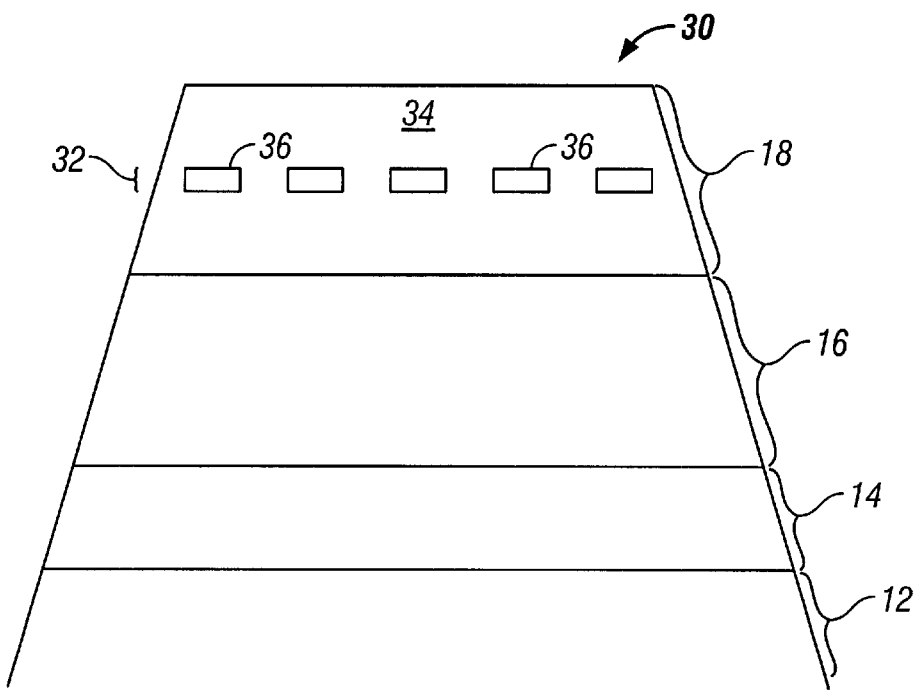
FIGS. 3 and 4 illustrate a schematic diagram of a VCSEL in accordance with an embodiment of the present invention.

Referring now to FIG. 3, a VCSEL 30 in accordance with an embodiment of the present invention is illustrated. As previously shown in FIG. 1, the VCSEL 30 is built on a substrate 12 of semiconductor material. The VCSEL 30 includes a first reflector 14 disposed on the substrate 12, an active region 16 disposed on the first reflector 14, and a second reflector 18 disposed on the active region 16 such that the active region 16 is interposed between the first reflector 14 and the second reflector 18.

In accordance with an embodiment of the present invention, a polarizer 32 is formed in the laser cavity, inside or on the top or bottom ends of the second reflector 18 (considered to be "inside" the second reflector in this application). For example, polarizer 32 may be formed in the bottom layer(s) of second reflector 18. The polarizer 32 comprises doped parallel stripes 36. In accordance with an embodiment of the present invention, the doped material of stripes 36 is substantially different (in doping) than the surrounding material, i.e. layer 34. That is, the layer 34 may be a p-type layer while the stripes 36 consist of an n-type material. The layer 34 may also be an n-type layer while the stripes 36 consist of a p-type material. The layer 34 may also be a p-type layer while the stripes 36 consist of a p+-type doped material, i.e., different in that it is more heavily doped, but of the same type, as the material of layer 34. Similarly, the layer 34 may be an n-type layer while the parallel stripes 36 are stripes of an n+-type material. The p– and p+-type materials may be materials such as Beryllium, Zinc, Carbon, and the like. The n– and n+-type materials may be materials such as Silicon, Tin, Selenium, and the like. In an embodiment, p–, p, and p+, and n–, n, and n+ denote doping at relative doping densities, where p and n type doping at a standard doping density, and the "–" or "+" suffix indicate a relatively lower or higher doping density, e.g. a factor of 2, or an order of magnitude, higher or lower. For example, in an embodiment, n-type doping may indicate a doping density of about $10^{18}/cm^3$, while n+ type doping is about $2\times10^{18}/cm^3$ to $10^{19}/cm^3$, and n– doping is about $5\times10^{17}/cm^3$; p-type doping may indicate a doping density of about $5\times10^{17}/cm^3$, while p+ type doping is about $10^{18}/cm^3$.

Polarizer 32 polarizes the light generated from the active region 16, by (substantially or relatively) reflecting the light with an E field vector in parallel to the stripes and by (substantially or relatively) transmitting the light with an E field vector perpendicular to the stripes. That is, polarizer 32 causes anisotropic reflection of light, so that the loss for light with an E field vector in parallel to the stripes is relatively high, while the reflection of light with an E field vector perpendicular to the stripes is relatively low and sufficient to permit lasing to occur for this latter polarized light.

Figure 4:
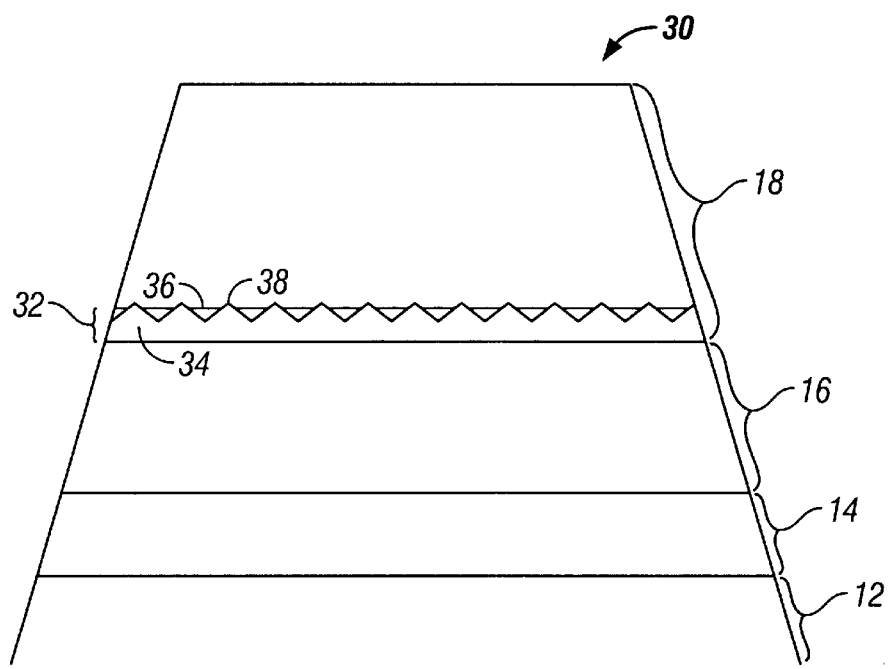

In accordance with an embodiment of the present invention, layer 34 is the bottom layer of DBR 18. In another embodiment, the polarizer 32 is monolithically fabricated in the bottom layer of the second reflector 18. It is etched to form periodic rows with substantially triangular cross-sections, as shown in FIG. 4. A differently-doped material is then grown, which substantially fills the valleys of the triangular cross sectional rows, but does not completely cover the peaks. This may be done during MBE growth of the bottom layer(s) 32 of DBR 18, which may be composed of p-type InP, for example, by switching the dopant to an n or n+ type dopant, to grow a layer which forms differently-doped grating or polarization stripes 36. Then, the dopant can be switched back to p-type to continue growing the rest of DBR 18, leaving buried n-type stripes 36, which form a grating or polarizer 32. In another embodiment, a dopant different than that in the layer 34 is diffused into the valleys of the triangular cross sectional rows.

Figure 5:
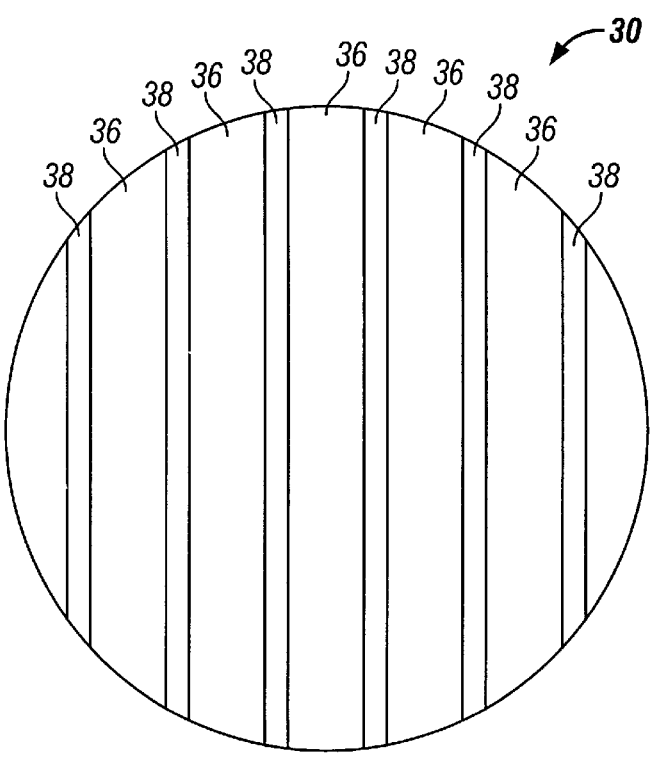
FIG. 5 illustrates a top view of the VCSEL of FIG. 3.

Polarization stripes 36 are further illustrated in the top view of FIG. 5. More specifically, FIG. 5 shows the grating formed by stripes 36 and the lines between stripes 36 formed by the peaks 38 of the substantially triangular cross-sections. (The widths shown for the grating lines and the distance between the lines in FIG. 5 are not to scale.). In an embodiment, the distance between the peaks 38 is greater than ¼λ, the wavelength of the laser light to be emitted and polarized.

Figure 6A:
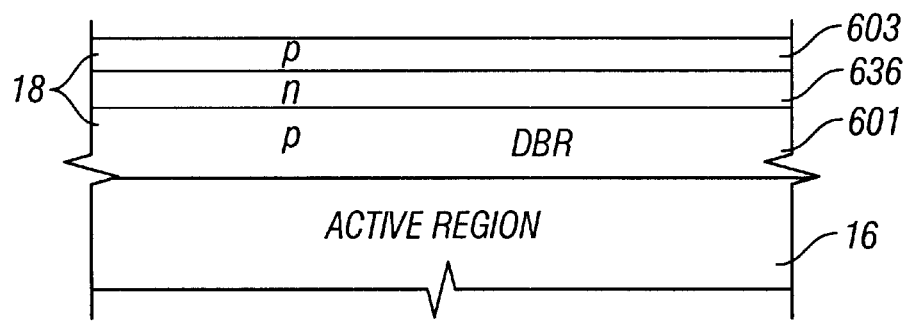
FIGS. 6A–C are cross-sectional views of the layer structure of the VCSEL array of FIG. 1 during fabrication, illustrating the fabrication of the polarizer structure of the present invention.
Figure 6B:
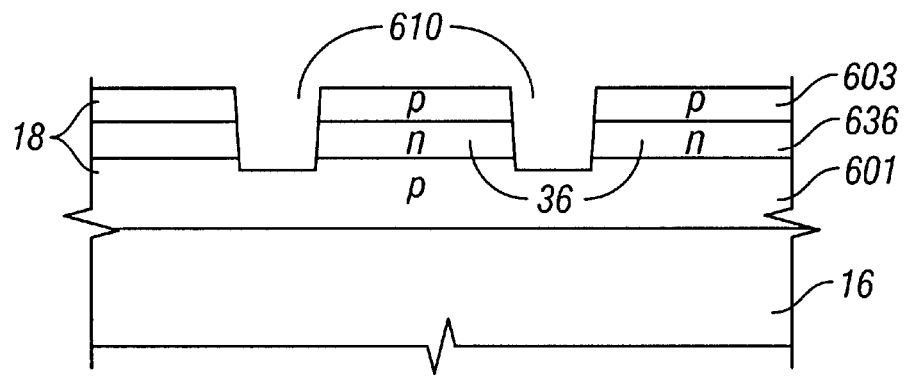
Figure 6C:
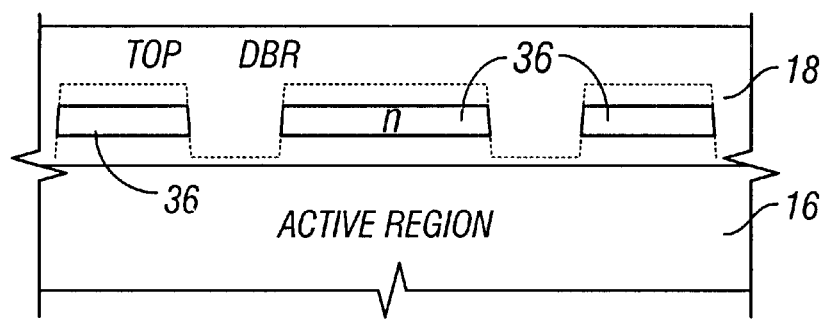

In another embodiment, stripes 36 may be formed as illustrated in FIGS. 6A–C, which are cross-sectional views of the layer structure of an alternative embodiment of the VCSEL array of FIG. 1 during fabrication. Top reflector or DBR 18 is a semiconductor DBR having a given doping type, such as n, n+, p, or p+ and, in an embodiment, p-type. As shown in FIG. 6A, first, a bottom section or layer(s) 601 of a DBR to form the top reflector 18 is grown on active region 16. DBR layer 601 has a certain doping type, e.g. p-type, and consists of a certain material, e.g. a semiconductor material such as InP. In an embodiment, layer 601 is part of the DBR and the polarizer stripes simply consist of the same material as the surrounding DBR material except differently doped, where "differently doped" means the stripes have a different doping polarity than that of the surrounding material (i.e., n instead of p, or vice-versa), or have the same "type" of doping but substantially higher (i.e., n+ instead of n, or p+ instead of p).

When layer 601 is grown, the dopant of the MBE machine can be switched from p to n (or n+) type dopant, to grow n-type layer 636, which will later form the stripes 36. Layer 636 may be, for example, about 200 Å thick. Then, the dopant is switched back to p-type to continue growing layer 603 of DBR 18. Layer 603 may be omitted in other embodiments, but is preferred in some embodiments so as to result in better quality polarizer stripes 36. As illustrated in FIG. 6B, growth of DBR 18 is then halted, and rows 610 are etched through layers 603 and 636, into layer 601. Re-growth commences with p-type DBR material covering etched grooves or rows 610 and the exposed sides of stripes 36, and joining with the other p-type material of DBR 18, to result in buried n-type material stripes 36, as shown in FIG. 6C. Because stripes 36 consist of the same material as the DBR in which they are buried (e.g., InP), light is not physically scattered by the stripes, unlike a metal grating.

In an alternative embodiment, layer 601 may be a special layer not part of the DBR mirror 18 but at the base thereof. In another embodiment, polarizer stripes 36 consist of a different material than the DBR layers. In an embodiment, the rows 610 may be initially much thicker than indicated in FIG. 5, and the profile of the etched grooves 610 may be substantially triangular.

The present invention can be applied to any VCSEL, e.g., optically pumped or electrically pumped, directly modulated or externally modulated. For example, the polarizer 32 may be integrated into an externally modulated VCSEL to produce a polarized beam. Such an application may be useful, e.g., to avoid having to use a polarizer before an external modulator, e.g., LiNiO$_3$. In accordance with another embodiment, in a VCSEL that is electrically pumped, the polarizer 32 generates an electrical field grating (period electric field) that polarizes the light. That is, the electrical field grating relatively reflects light with an E field vector in parallel to the electric field grating lines and relatively transmits light with an E field vector perpendicular to the electric field grating lines. This electrical field grating is generated when the charged carriers inside the VCSEL 30 are forced to go between the polarizer stripes, e.g. through the peaks 38 (FIG. 4) or through the spaces (corresponding to rows 610) between stripes 36 (FIG. 6). The present invention would also be very useful in other applications, such as optical free-space routing and in a polarization-duplicated transmitter, or optical head.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A method for fabricating a vertical-cavity surface-emitting laser (VCSEL), the method comprising the steps of:
   providing a substrate;
   disposing a first reflector on the substrate;
   disposing an active region on the first reflector;
   disposing a second reflector on the active region such that the active region is interposed between the first reflector and the second reflector; and
   forming a polarizer inside the second reflector, wherein the polarizer comprises parallel stripes of material doped differently than that of the second reflector, wherein the polarizer polarizes light generated from the active region.

2. The method of claim 1, wherein the stripes are composed of the same material as the second reflector.

3. The method of claim 1, wherein the second reflector is a p-type doped material and the stripes are a p+-type doped material.

4. The method of claim 1, wherein the second reflector is an n-type doped material and the stripes are an n+-type doped material.

5. The method of claim 1, wherein the second reflector is a p-type doped material and the stripes are an n-type doped material.

6. The method of claim 1, wherein the second reflector is an n-type doped material and the stripes are a p-type doped material.

7. The method of claim 1, wherein the polarizer imposes relatively more loss for light having an E field vector parallel to the stripes than for light not having an E field vector parallel to the stripes.

8. The method of claim 1, wherein the polarizer is monolithically formed in the bottom layers of the second reflector.

9. The method of claim 1, wherein the reflectors are distributed Bragg reflector (DBR) mirrors.

10. The method of claim 9, wherein the reflectors are semiconductor DBRs.

11. The method of claim 9, wherein the second reflector is neutrally doped and the stripes are doped with one of an n-type and a p-type material.

12. The method of claim 1, wherein the stripes are about 200 Å thick.

13. The method of claim 1, wherein the step of forming a polarizer comprises the steps of:
   growing a first layer of a first doped material on the active region;
   growing a second layer of a second doped material on the first layer;
   growing a third layer of the first doped material on the second layer;
   etching one or more grooves through the second and third layers into the first layer; and
   covering the etched grooves with the first doped material so as to form parallel stripes with the second layer.

14. A VCSEL comprising:
   a substrate;
   a first reflector disposed on the substrate;
   an active region disposed on the first reflector; and
   a second reflector disposed on the active region such that the active region is interposed between the first reflector and the second reflector, wherein the second reflector comprises a polarizer for polarizing light generated from the active region, wherein the polarizer comprises parallel stripes of material doped differently than that of the second reflector.

15. The VCSEL of claim 14, wherein the stripes are composed of the same material as the second reflector.

16. The VCSEL of claim 14, wherein the second reflector is a p-type doped material and the stripes are a p+-type doped material.

17. The VCSEL of claim 14, wherein the second reflector is an n-type doped material and the stripes are an n+-type doped material.

18. The VCSEL of claim 14, wherein the second reflector is a p-type doped material and the stripes are an n-type doped material.

19. The VCSEL of claim 14, wherein the second reflector is an n-type doped material and the stripes are a p-type doped material.

20. The VCSEL of claim 14, wherein the polarizer imposes relatively more loss for light having an E field vector parallel to the stripes than for light not having an E field vector parallel to the stripes.

21. The VCSEL of claim 14, wherein the polarizer is monolithically formed in the bottom layers of the second reflector.

22. The VCSEL of claim 14, wherein the reflectors are distributed Bragg reflector (DBR) mirrors.

23. The VCSEL of claim 14, wherein the reflectors are semiconductor DBRS.

24. The VCSEL of claim 23, wherein the second reflector is neutrally doped and the stripes are doped with one of an n-type and a p-type material.

25. The VCSEL of claim 14, wherein the stripes are about 200 Å thick.

26. A method fabricating a polarizer for polarizing light in a VCSEL having a substrate, a first reflector disposed on the substrate, an active region disposed on the first reflector, and a second reflector disposed on the active region such that the active region is interposed between the first reflector and the second reflector, the method comprising the steps of:
   growing a first layer of a first doped material on the active region;
   growing a second layer of a second doped material on the first layer;
   growing a third layer of the first doped material on the second layer;
   etching one or more grooves through the second and third layers into the first layer; and
   covering the etched grooves with the first doped material so as to form parallel stripes with the second layer, whereby the polarizer imposes relatively more loss for light having an E field vector parallel to the stripes than for light not having an E field vector parallel to the stripes.

27. A method for fabricating a polarizer, the method comprising:
   growing a first semiconductor layer of a first doped material;
   growing a second semiconductor layer of a second doped material on the first semiconductor layer;
   growing a third semiconductor layer of the first doped material on the second semiconductor layer;
   etching one or more grooves through the second and third semiconductor layers into the first semiconductor layer; and
   covering the etched grooves with the first doped material so as to form parallel stripes with the second semiconductor layer, wherein the polarizer imposes relatively more loss for light having an E field vector parallel to the stripes than for light not having an E field vector parallel to the stripes.

28. The method of claim 27, wherein the first doped material is a p-type doped material and the second doped material is an n-type doped material.

29. The method of claim 27, wherein the first doped material is an n-type doped material and the second doped material is a p-type doped material.

30. The method of claim 27, wherein the first doped material is a p-type doped material and the second doped material is a p+-type doped material.

31. The method of claim 27, wherein the first doped material is an n-type doped material and the second doped material is an n+-type doped material.

32. A polarizer comprising:
   a semiconductor layer having parallel stripes of material doped differently than that of the semiconductor layer, wherein the stripes are composed of the same material as the semiconductor layer, wherein the polarizer imposes relatively more loss for light having an E field vector parallel to the stripes than for light not having an E field vector parallel to the stripes.

33. A method for polarizing light in a VCSEL having a substrate, a first reflector disposed on the substrate, an active region disposed on the first reflector, and a second reflector disposed on the active region such that the active region is interposed between the first reflector and the second reflector, the method comprising:
   generating light in the active region of the VCSEL; and
   subjecting the light to a polarizer fabricated inside the second reflector, wherein the polarizer comprises parallel stripes of material doped differently than that of the second reflector.

34. The method of claim 33, wherein the stripes are composed of the same material as the second reflector.

35. The method of claim 33, wherein the second reflector is a p-type doped material and the stripes are a p+-type doped material.

36. The method of claim 33, wherein the second reflector is an n-type doped material and the stripes are an n+-type doped material.

37. The method of claim 33, wherein the second reflector is a p-type doped material and the stripes are an n-type doped material.

38. The method of claim 33, wherein the second reflector is an n-type doped material and the stripes are a p-type doped material.

39. The method of claim 33, wherein the step of subjecting the light comprises the steps of imposing relatively more loss for light having an E field vector parallel to the stripes than for light not having an E field vector parallel to the stripes.

40. The method of claim 26, wherein the first doped material is a p-type doped material and the second doped material is an n-type doped material.

41. The method of claim 26, wherein the first doped material is an n-type doped material and the second doped material is a p-type doped material.

42. The method of claim 26, wherein the first doped material is a p-type doped material and the second doped material is a p+-type doped material.

43. The method of claim 26, wherein the first doped material is an n-type doped material and the second doped material is an n+-type doped material.

* * * * *